United States Patent
Rozenblit et al.

(10) Patent No.: US 8,737,941 B2
(45) Date of Patent: May 27, 2014

(54) GAIN CONTROL SYSTEMS AND METHODS FOR CONTROLLING AN ADJUSTABLE POWER LEVEL

(71) Applicant: Skyworks Solutions, Inc., Woburn, MA (US)

(72) Inventors: Dmitriy Rozenblit, Irvine, CA (US); Darioush Agahi, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 56 days.

(21) Appl. No.: 13/629,464

(22) Filed: Sep. 27, 2012

(65) Prior Publication Data
US 2013/0090077 A1    Apr. 11, 2013

Related U.S. Application Data

(63) Continuation of application No. PCT/US2010/029261, filed on Mar. 30, 2010.

(51) Int. Cl.
*H04B 1/04* (2006.01)

(52) U.S. Cl.
USPC ........ 455/127.2; 455/91; 455/127.1; 455/136; 455/138

(58) Field of Classification Search
CPC .......... H04B 2001/0416; H04W 52/52; H03G 2201/10; H03G 2201/106; H03G 2201/30
USPC ............. 455/91, 123, 127.1, 127.2, 136, 138, 455/232.1, 234.1, 240.1
See application file for complete search history.

(56) References Cited

U.S. PATENT DOCUMENTS

| | | | |
|---|---|---|---|
| 6,321,073 B1* | 11/2001 | Luz et al. | 455/239.1 |
| 6,795,694 B2* | 9/2004 | Uesugi | 455/126 |
| 2001/0023190 A1 | 9/2001 | Kim | |
| 2007/0184793 A1* | 8/2007 | Drogi et al. | 455/127.1 |

OTHER PUBLICATIONS

International Preliminary Report on Patentability and Written Opinion, re International Application No. PCT/US2010/029261, dated Oct. 2, 2012.

* cited by examiner

*Primary Examiner* — Tuan Pham
(74) *Attorney, Agent, or Firm* — Knobbe, Martens, Olson & Bear, LLP

(57) ABSTRACT

A system, such as a transceiver, for controlling an adjustable power level includes first and second power detectors, a network of attenuators, a compensator, a comparator, and a controller. The first power detector measures the power of a signal. The network of attenuators receives the signal and generates an attenuated signal. The compensator receives the attenuated signal and generates a compensated signal. The second power detector measures the power of the compensated signal. The comparator receives the respective outputs from the first and second power detectors and generates a first error signal. The controller enables the fixed attenuation, correspondingly adjusts the variable attenuation, receives a second error signal, and provides a control signal to the network of attenuators to nullify an attenuation mismatch introduced between the fixed attenuation and the variable attenuation. A corresponding method for controlling an adjustable power level is also disclosed.

23 Claims, 7 Drawing Sheets

GAIN CONTROL SYSTEMS AND METHODS FOR CONTROLLING AN ADJUSTABLE POWER LEVEL

CROSS-REFERENCE TO RELATED APPLICATIONS

This application is a continuation of International Application No. PCT/US2010/029261, filed Mar. 30, 2010, the benefit of the filing date of which is hereby claimed and the specification of which is incorporated herein by this reference.

BACKGROUND

As the designs of portable radio frequency (RF) communication devices, such as cellular telephones, personal digital assistants (PDAs), WIFI transceivers, and other mobile communication devices evolve, such devices must be capable of adjusting transmitted power accurately over a relatively wide dynamic range. For example, in the emerging markets of 3G/3.9G, linear systems such as those that communicate in accordance with standards such as WCDMA, WiMAX, EUTRAN-LTE, and other non-constant envelope modulation methodologies, the requirements for those standards for accurate transmitted power control continue to present challenges.

In mobile communication systems, power control is implemented to ensure that the power level of communication signals arriving at a base station from various mobile devices are relatively the same. To accomplish this goal, the base station continuously monitors the received signal power from each mobile device communicating with the base station. The base station directs each mobile device to adjust the transmit power level depending upon its distance, data rate change, or channel condition. The third generation partnership project (3GPP) specification calls for a maximum output power for a mobile handset of 24 dBm. A minimum output power for a mobile handset is −57 dBm. The difference between 24 dBm and −57 dBm results in a dynamic range of transmitted power of 81 dB. Providing such a dynamic range in a mobile communication device is not a difficult task. However, the 3GPP specification further includes a specification for transmit power step tolerance that with smaller commanded step sizes step sizes in transmit power becomes more stringent. A transmit power step tolerance describes a range of acceptable power levels in response to a base station command communicated to the mobile communication device that directs the device to adjust its transmit power. Table I below illustrates the transmit power step tolerance in accordance with the 3GPP specification. For example, when the base station directs the mobile communication device to increase transmitted power by 3 dB, the mobile communication device is required to increase transmitted power by 1.5 dB to 4.5 dB. As indicated in the first line of Table I, when no change in transmitted power is commanded by the base station, the transmitted power from the mobile communication device is required to not increase or decrease by more than 0.5 dB.

TABLE I

| POWER STEP SIZE ΔP(DB) | TRANSMITTED POWER STEP TOLERANCE (DB) |
|---|---|
| 0 | ±0.5 |
| 1 | ±0.5 |
| 2 | ±1.0 |
| 3 | ±1.5 |
| 4 ≤ ΔP ≤ 10 | ±2.0 |
| 11 ≤ ΔP ≤ 15 | ±3.0 |
| 16 ≤ ΔP ≤ 20 | ±4.0 |
| 21 ≤ ΔP | ±6.0 |

A conventional transmitter includes a combination of three variable attenuators. Generally, two of the variable attenuators are connected in series with a third variable attenuator connected between the first two attenuators in shunt to ground (e.g., a "T" attenuator). Attempts to control the output power by controllably adjusting the attenuation provided by the variable attenuators to provide the transmitted power step tolerance of the 3GPP specification are problematic in that they require factory calibration to adjust for production tolerances and temperature variation over a relatively wide range of operational temperatures for the separate independent attenuation stages.

SUMMARY

Embodiments of a gain control system and a method for controlling an adjustable power level eliminate gain discontinuities when generating adjacent adjustable gain states over a select portion of a range of adjustable gain states by selectively applying one or more fixed gain element(s) and correspondingly adjusting one or more variable gain element(s). The gain control system and method for controlling an adjustable power level provide a more accurate and continuous power level transfer function when compared to factory calibration solutions which can fail when a transceiver is operating under a host of changing conditions in the field.

An embodiment of a gain control system includes first and second power detectors, a network of attenuators, a compensator, and a comparator. The first power detector measures the power of a signal and provides a first power detector output. The network of attenuators includes a fixed attenuation and a variable attenuation. The network of attenuators receives the signal and provides an attenuated signal. The compensator receives the attenuated signal and amplifies the same in an amount proximate to the fixed attenuation to generate a compensated signal. The second power detector measures the power of the compensated signal and provides a second power detector output. The comparator receives the first power detector output and the second power detector output and generates a first error signal.

An embodiment of a method for controlling an adjustable power level using a network of attenuators that includes a fixed attenuation and a variable attenuation, includes the steps of using a controller to adjust the variable attenuation until the attenuation of the variable attenuation approaches an attenuation of the fixed attenuation, using a compensator at an output of the network of attenuators to provide gain to an attenuated signal in an amount proximate to the fixed attenuation to generate a compensated signal at a compensator output, in a comparator, measuring a difference between a first power level of a non-attenuated signal and a second power level of the compensated signal to generate a first error signal and storing the first error signal.

Other systems, methods, features, and advantages will be or will become apparent to one with skill in the art upon examination of the following figures and detailed description.

It is intended that all such additional systems, methods, features, and advantages be included within this description, be within the scope of and protected by the accompanying claims.

BRIEF DESCRIPTION OF THE FIGURES

The gain control systems and methods for controlling an adjustable power level can be better understood with reference to the following figures. The components within the figures are not necessarily to scale, emphasis instead being placed upon clearly illustrating the principles of how to eliminate gain discontinuities when selecting adjacent adjustable gain states over a select portion of a range of adjustable gain states. Moreover, in the figures, like reference numerals designate corresponding parts throughout the different views.

DETAILED DESCRIPTION

Figure 1:
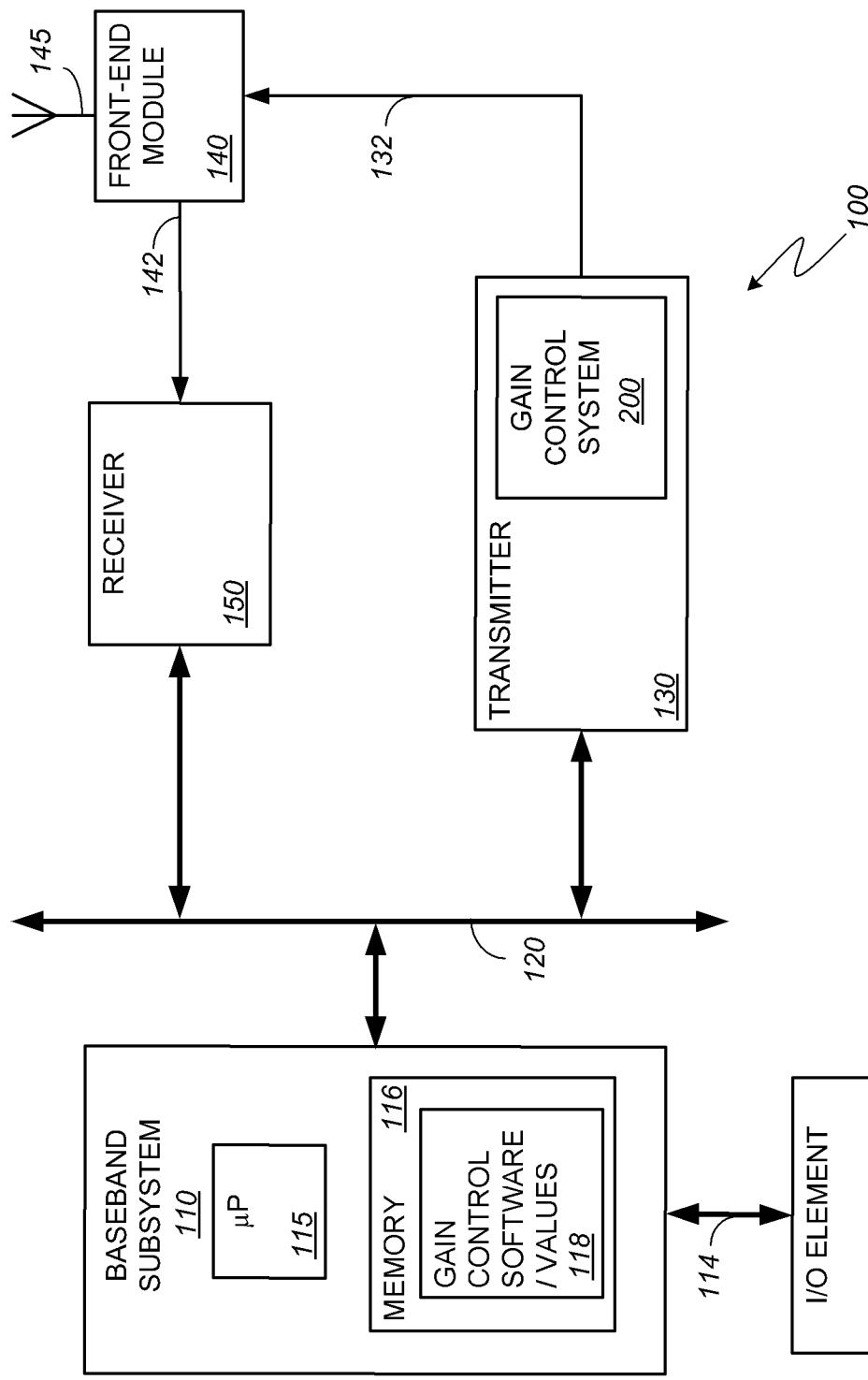
FIG. 1 is a block diagram of an embodiment of a simplified portable transceiver including a gain control system.

Although the exemplary embodiments are described in relation to a portable RF transceiver, and more specifically a transmitter in a portable RF transceiver, embodiments of the present gain control systems and methods for controlling an adjustable power level can be applied in any application where a continuous and adjustable output power is desired.

The gain control systems and methods for controlling an adjustable power level can be implemented in hardware, software, or a combination of hardware and software. When implemented in hardware, the gain control systems and methods for controlling an adjustable power level can be implemented using specialized hardware elements and logic. When the gain control systems and methods for controlling an adjustable power level are implemented partially in software, the software portion can be used to control components in a transmitter or a power amplifier control element so that various operating aspects can be software-controlled. The software can be stored in a memory and executed by a suitable instruction execution system (e.g., a microprocessor). The hardware implementation of the gain control systems and methods for controlling an adjustable power level can include any or a combination of the following technologies, which are all well known in the art: discrete electrical components, amplifiers, comparators, a discrete logic circuit(s) having logic gates for implementing logic functions upon data signals, an application specific integrated circuit having appropriate logic gates, a programmable gate array(s) (PGA), a field programmable gate array (FPGA), etc.

The software for controlling components in a transmitter, such as a gain control system, comprises an ordered listing of executable instructions for implementing logical functions, and can be embodied in any computer-readable medium for use by or in connection with an instruction execution system, apparatus, or device, such as a computer-based system, processor-containing system, or other system that can retrieve the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

A combination of elements that generate a negative gain (e.g., radio-frequency attenuators) can be arranged with a compensator (e.g., an amplifier or amplifiers) capable of generating an output with a substantially equivalent positive gain to offset signal power loss in a fixed attenuation to provide nearly continuous control of a signal power level over a desired range of signal power levels. One or more fixed RF attenuators can be arranged in a circuit. A switch in parallel with each of the respective one or more fixed RF attenuators can be controllably closed to bypass the attenuation provided by a respective RF attenuator. One or more variable RF attenuators can be added to the circuit. A variable RF attenuator is a circuit element with negative gain that varies as a function of a signal parameter applied at a control signal input. If the variable attenuation (i.e., the range of the negative gain) is greater than the attenuation of a fixed RF attenuator, a control solution can be arranged to avoid discontinuity in the power of a signal that traverses the circuit. A network of RF attenuators including at least one fixed attenuator and a variable attenuator, power detectors, a compensator, a comparator and a controller, as well as one or more converters, can be configured or controllably updated as desired to adjust a variable RF attenuator in a network of RF attenuators to remove discontinuities in transmitted power over a broad range of transmit signal power.

The example gain control systems and methods smooth or reduce output power level discontinuities that are introduced when fixed and variable RF attenuators are switched or otherwise adjusted to provide a step change in attenuation. The attenuation provided by the fixed RF attenuator is offset by a compensator, which applies a substantially equivalent positive gain to an attenuated version of the transmit signal. For example, if the fixed RF attenuator provides 10 dB of attenuation to the received signal (i.e., a pre-attenuation signal), then the compensator provides 10 dB of gain. A transmit signal power is monitored at an input of the gain control system. The transmit signal (i.e., a post-attenuation signal) is adjusted by the compensator to offset the attenuation introduced by the fixed RF attenuator. These pre-attenuation and post-attenuation signals are compared to generate a first error signal that is forwarded to a controller. After enabling the fixed attenuation and reducing the variable attenuation by a substantially equivalent attenuation to that provided by the fixed attenuator(s), the gain control system measures the power of the pre-attenuation and compensated post-attenuation signals to generate a second error signal. The controller generates a control signal in response to a function of the first error signal and the second error signal. In this way, the controller, through the control signal, adjusts the variable RF attenuator to reduce any discontinuities in signal power introduced in the network of attenuators.

The gain control system, as shown in the following exemplary embodiments, can achieve a practical attenuation range of 2*(Att_Fx), where Att_Fx represents the attenuation of the fixed RF attenuator. The controlled attenuation range can be extended by another (Att_Fx) by switching in an additional fixed RF attenuator, introducing an additional compensator gain G in an amount substantially equal to the attenuation of the additional fixed RF attenuator, and repeating the same process at the next switching point. Additional variable attenuator stages are not needed.

In general, the attenuation range can be extended by N*(Att_Fx) by adding N additional fixed attenuators and N additional compensator gains to the gain control system. Each time, the adjustment is performed in the following order. The variable attenuation starts close to zero and is increased until it is about equal to the attenuation introduced by one fixed attenuator or Att_Fx, at which point the error signal approaches zero and the bypass switch for the next fixed attenuator is opened while the variable attenuation is simultaneously reduced by Att_Fx (dB). The variable attenuator is adjusted until the error is unchanged from its value before the switch. Thereafter, another compensator with a gain of G (dB), where G is approximately equal to Att_Fx is enabled to prepare for the next cycle. This process could be repeated with additional fixed attenuators and compensator gains, the practical limit being where the total attenuation becomes so great that the compensator output becomes too noisy to rely on.

Although described in association with an increase in attenuation provided by a network of attenuators, it should be understood that the gain control system and methods apply equally to decreases in attenuation. That is, as the variable attenuator is directed to provide less variable attenuation, the controller will determine when it is appropriate to remove a fixed attenuation provided by a fixed attenuator and replace the fixed attenuation with a substantially equivalent variable attenuation. A comparison of the error signal values generated before and after the change in the network of attenuators can be used to generate a control signal to further adjust the variable attenuator to reduce discontinuities in signal power introduced in the network of attenuators.

In accordance with an illustrative or exemplary embodiment of the gain control systems and methods for controlling an adjustable power level, FIG. 1 includes a block diagram illustrating a simplified wireless communication system 100 including a gain control system 200. The wireless communication system 100 includes a baseband subsystem 110, an input/output (I/O) element 112, a transmitter 130, a front-end module 140, an antenna 145, and a receiver 150. The I/O element 112 is coupled to the baseband subsystem 110 via connection 114. The I/O element 112 represents any interface with which a user may interact with the wireless communication system 100. For example, the I/O element 112 may include a speaker, a display, a keyboard, a microphone, a trackball, a thumbwheel, or any other user-interface element. A power source (not shown), which may be a direct-current (DC) battery or other power source, is also connected to the baseband subsystem 110 to provide power to the wireless communication system 100. In a particular embodiment, the wireless communication system 100 can be, for example but not limited to, a portable-telecommunication device such as a mobile cellular-type telephone.

The baseband subsystem 110 includes microprocessor (g) 115 and memory 116. The microprocessor 115 and the memory 116 are in communication with each other. Depending on the manner in which the baseband subsystem 110 controls the transmitted power level emitted from the wireless communication system 100, the baseband subsystem 110 may also include one or more of an application-specific integrated circuit (ASIC), a field programmable gate array (FPGA), or any other implementation-specific or general processor, among other devices.

The baseband subsystem 110, via microprocessor 115 and the memory 116, provides the signal timing, processing, input, output, and storage functions for the wireless communication system 100. In addition, the baseband subsystem 110 generates various control signals, such as power control signals, filter control signals, and modulator control signals that are used to direct various functions within the transmitter 130, the front-end module 140, and the receiver 150 as known to those skilled in the art. The various control signals may originate from the microprocessor 115 or from any other processor within the baseband subsystem 110, and are supplied to a variety of connections within the transmitter 130, the front-end module 140, and the receiver 150. It should be noted that, for simplicity, only the basic components of the wireless communication system 100 are illustrated herein.

If portions of the gain control system 200 and the methods for controlling an adjustable power level are implemented in software that is executed by the microprocessor 115, the memory 116 will also include gain control software 118. The gain control software 118 comprises one or more executable code segments and or data values that can be stored in the memory 116 and executed in the microprocessor 115. Alternatively, the functionality of the gain control software 118 can be coded into an ASIC (not shown) or can be executed by an FPGA (not shown), or another device. The functionality of the gain control software 118 can also be provided by a suitably configured controller in the gain control system 200 of the transmitter 130. Because the memory 116 can be rewritable and because a FPGA is reprogrammable, updates to the gain control software 118 including gain stages or ranges, data, etc. can be remotely sent to and saved in the wireless communication system 100 when implemented using either of these methodologies.

In one embodiment, the gain control software 118 includes one or more executable code segments for generating power step commands that are forwarded to the gain control system 200. The gain control software 118 operates in response to power control commands received from a remote base station. Example power control commands direct the mobile communication device 100 to increase or decrease emitted power. Example power step commands generated in the baseband subsystem 110 and received by the gain control system 200 may include an indicator and a relative value in dB. The indicator directs the gain control system 200 to increase or decrease transmit signal power. The relative value defines the desired step change in emitted power. The baseband subsystem 110 may include additional software, firmware or other elements that operate in conjunction with transmitter elements other than the gain control system 200 to further adjust the power of an RF signal emitted from the mobile communication device 100. Exemplary transmitter elements include mixers, filters, power amplifiers, attenuators (other than those in the gain control system 200), among other elements that can affect the emitted power of a RF signal transmitted from the mobile communication device 100.

As will be explained in greater detail in association with the detailed description of the embodiment of the gain control system 200 shown in FIG. 2, the baseband subsystem 110 will, at appropriate times, communicate power step change commands to the gain control system 200. Moreover, the arrangement and operation of the gain control system 200 will be further explained in association with the functional block diagrams of FIGS. 2-5.

The transmitter 130 includes a modulator (not shown), which modulates the analog signals and provides a modulated signal to an upconverter (not shown). The upconverter transforms the modulated signal on to an appropriate transmit frequency and provides the upconverted signal to a power amplifier (not shown). The power amplifier amplifies the upconverted signal to an appropriate power level for the communication protocol or standard in which the wireless communication system 100 is designed to operate. The modulated, upconverted, amplified, and gain-controlled transmit signal is forwarded to front-end module 140 via connection 132. The gain control system 200 is introduced to dynamically and selectively manage transitions in the transmitted power that result from controlled adjustment of fixed and variable RF attenuators in the transmitter 130 of the wireless communication system 100.

The front-end module 140 comprises an antenna system interface that may include, for example, a diplexer having a filter pair that allows simultaneous passage of both transmit signals and receive signals in respective frequency ranges, as known to those skilled in the art. The transmit signal is supplied from the front-end module 140 to the antenna 145 for signal transmission to suitably configured communication devices, such as a base station, remote from wireless communication system 100.

A signal received by an antenna 145, from the base station or other emitter, is directed from the front-end module 140 to the receiver 150 via connection 142. The receiver 150 includes various components to downconvert (i.e., translate in frequency), digitize, and filter a recovered data signal from a receive signal, as known to those skilled in the art. A mixing stage downconverts and separates the received RF signal into in-phase (I) and quadrature-phase (Q) receive signals. The I and Q receive signals are sampled and transformed into digital signals by one or more analog to digital converters (ADCs). One or more specialized digital filters are introduced to further process the I and Q received signals.

The transmitter 130 and the receiver 150 may be co-located in an integrated transceiver, such as when the transmitter 130 and the receiver 150 are implemented on a radio-frequency (RF) integrated circuit (IC). In alternative embodiments, the receiver 150 and the transmitter 130 are implemented on separate ICs. Under both architectures, the gain control system 200 is preferably implemented in hardware on an integrated circuit in the transmitter 130.

Figure 2:
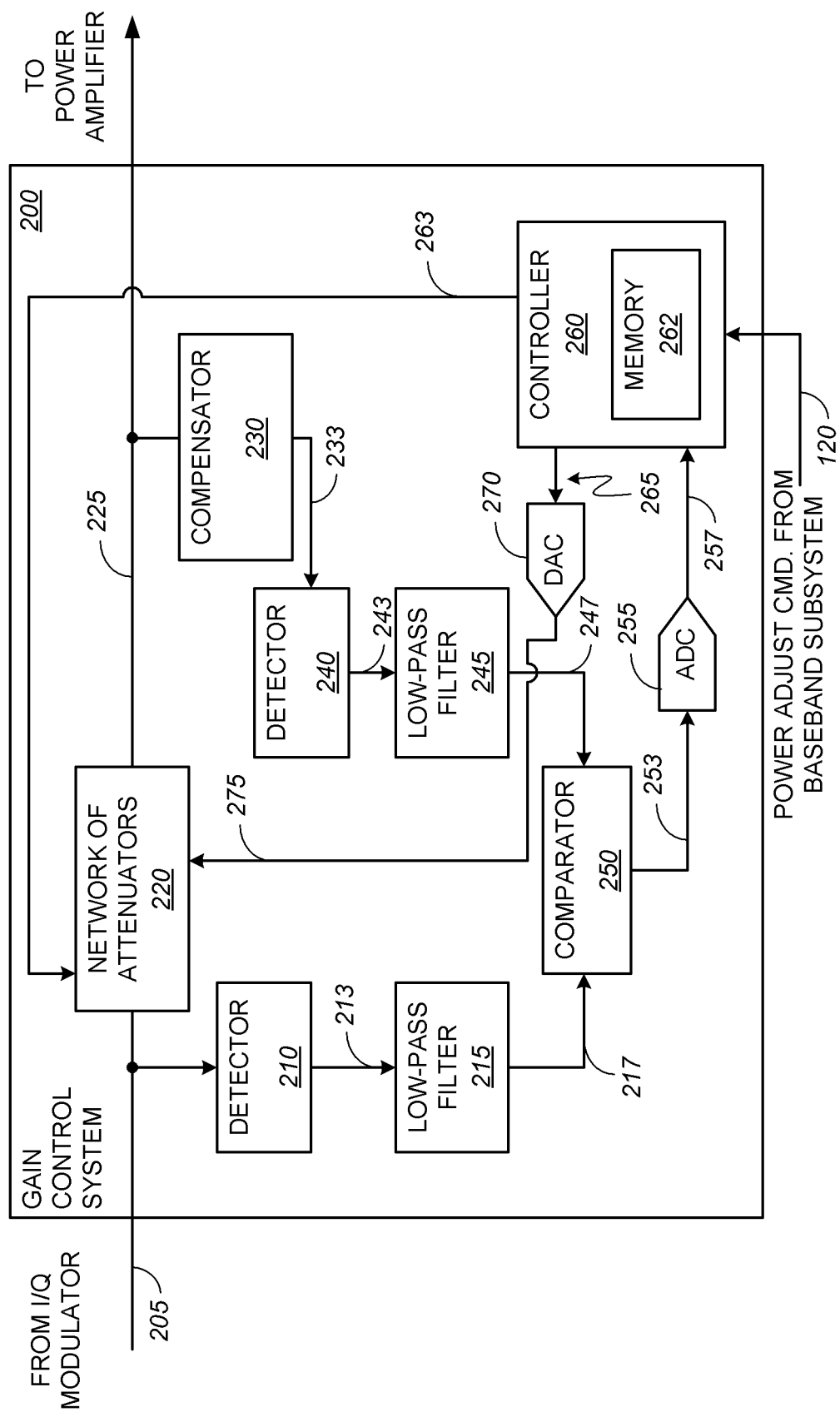
FIG. 2 is a schematic diagram of an embodiment of the gain control system of FIG. 1.

FIG. 2 is a block diagram of an embodiment of the gain control system 200 of FIG. 1. In the illustrated embodiment, the gain control system 200 includes a first detector 210, a network of attenuators 220, a compensator 230, a second detector 240, a comparator 250, and a controller 260. The gain control system 200 receives an input signal on connection 205 and generates an output signal on connection 225. A network of attenuators 220 is connected in series between the connection 205 and the connection 225. The network of attenuators 220 includes a fixed attenuator (not shown) that provides a fixed attenuation and a variable attenuator (not shown) that provides a variable attenuation. The network of attenuators 220 generates an attenuated signal on connection 225.

In the illustrated embodiment, the connection 205 is coupled to an in-phase/quadrature phase modulator or IQ modulator (not shown) in the transmitter 130 of the portable transceiver 100 (FIG. 1). In alternative embodiments, the input signal could be coupled to any signal generator where it is desirable to adjust output signal power such that step transitions in output signal power are closely controlled.

The first detector 210 receives the input signal on connection 205 and provides a first detector output on connection 213 to the low-pass filter 215. The first detector output is a signal that is a function of the total signal power received from the I/Q modulator on connection 205. A first low-pass filter 215 receives the output from the first detector 210 on connection 213. The low-pass filter 215 reduces the magnitude of signal components received via connection 213 from the first detector 210 that have a frequency above a cutoff frequency of the filter. The low-pass filter 215 can be implemented as an active filter or a passive filter. An active filter can comprise a circuit of passive circuit elements (e.g., resistors, capacitors, or inductors) in one or more feedback paths of an amplifier. A passive filter will include an arrangement of passive circuit elements. The cutoff frequency of the low-pass filter 215 can be controllably adjusted by varying one or more of the resistances, capacitances, or inductances of the passive elements of the filter as is well known in the art. However implemented or adjusted, the low-pass filter 215 forwards on connection 217 a filtered representation of the first detector output to a first input of the comparator 250.

The compensator 230 receives the attenuated signal on connection 225. The compensator provides gain or amplifies the attenuated signal in an amount that approximates the amount of attenuation provided by the fixed attenuator from the network of attenuators 220 to generate a compensated signal, which is coupled on connection 233 to the second detector 240.

The second detector 240 receives the compensated or gain adjusted signal on connection 233 and provides a second detector output on connection 243 to the low-pass filter 245. The output from the second detector 240 is a signal proportional to the power of the signal received from the compensator 230. The signal proportional to the signal power received from the compensator 230 is forwarded on connection 243 to the low-pass filter 245. The low-pass filter 245 reduces the magnitude of signal components received via connection 243 from the second detector 240 that have a frequency above a cutoff frequency of the filter. The low-pass filter 245 can be implemented as an active filter or a passive filter. An active filter can comprise a circuit of passive circuit elements (e.g., resistors, capacitors, or inductors) in one or more feedback paths of an amplifier. A passive filter will include an arrangement of passive circuit elements. The cutoff frequency of the low-pass filter 245 can be controllably adjusted by varying one or more of the resistances, capacitances, or inductances in the passive elements of the filter as is well known in the art. However implemented or adjusted, the low-pass filter 245 forwards on connection 247 a filtered representation of the second detector output to a second input of the comparator 250.

The comparator 250 receives the first detector output on a first input along connection 217 and the second detector output on a second input along connection 247. The comparator 250 generates an error signal, which is forwarded on connection 253 to an analog-to-digital converter (ADC) 255 before being forwarded to the controller 260 on connection 257. The error signal is a function of the difference of the signal voltages present at the first and second inputs of the comparator 250.

The controller 260 receives a digital representation of the error signal on connection 257 from the ADC 255. As described above, the controller 260 is coupled to a fixed attenuator in the network of attenuators 220 via an enable/disable signal, which the controller 260 provides on connection 263 and a control signal, which the controller 260 provides on connection 265. In the illustrated embodiment, the controller 260 is a digital element that includes a memory 262. The memory 262 can hold or store the error signal for comparison with a subsequent error signal. As will be explained in greater detail below, the controller 260 generates the control signal on connection 265 as a function of a first or stored error value and a second or subsequent error signal received on connection 255. Since the controller 260 is a digital element, the control signal on connection 265 is a digital word that is translated by the digital-to-analog converter (DAC) 270 into an analog value that is forwarded on connection 275 to a variable attenuator in the network of attenuators 220.

The controller 260 is enabled and operates in accordance with one or more signals provided from the baseband subsystem 110 via bus 120. For example, there are two main ranges of power control for a 3G mobile transmitter. In a first or high-power control range (e.g., a transmit signal power of approximately +5 dBm to +24 dBm, measured at antenna 145) the controller 260 may be disabled or turned off after configuring the network of attenuators 220. In this first or high-power control range, the network of attenuators 220 can be bypassed entirely or otherwise configured to provide little or no attenuation while the transmitted power level is adjusted by controlling the gain of a power amplifier (not shown). In this high-power mode, the transmitter output power can be measured using a diode detector (not shown) at the power amplifier output. In a second or low-power control range (e.g., less than about +5 dBm at antenna 145), the controller 260 is enabled or powered on. In this case, the power amplifier gain is a constant, and the output power of the power amplifier is out of range of the diode detector, which can no longer provide a reliable measure of the output power. So, power control is achieved in the low-power control range by controlling the input power to the power amplifier, i.e., by adjusting the total attenuation provided by the network of attenuators 220. In accordance with the schedule provided in Table I, only relative accuracy is required (i.e., accurate step changes in signal power). The gain control system 200 accomplishes an accurate step change in emitted signal power in a manner that eliminates attenuation discontinuities that would otherwise degrade the step accuracy.

When the required transmit power step tolerance provides for a greater tolerance (see Table I), the controller 260 could be applied in an open loop control mode absent compensation or error information. When a tighter step tolerance is required, gain compensated error information can be provided to the controller 260 to keep the change in error signal values relatively small.

Because the error signal is generated as a result of a comparison of power-adjusted signals, accuracy requirements of the amount of the gain, G, of the compensator 230, the attenuation (Att_Fx) of the fixed attenuator 322, and offsets in the first detector 210, the second detector 240, and the comparator 250 are relatively low.

Figure 3:
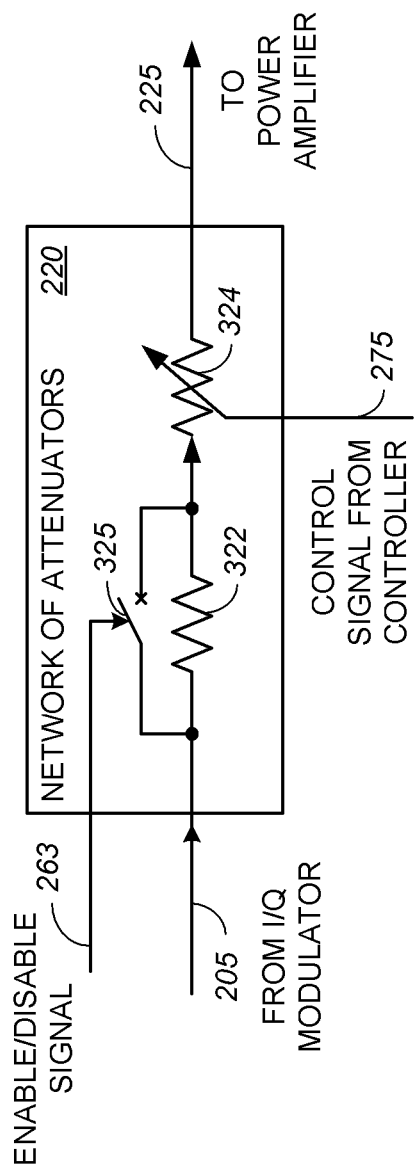
FIG. 3 is a schematic diagram of an embodiment of the network of attenuators of FIG. 2.

FIG. 3 is a schematic diagram of an embodiment of the network of attenuators 220 of FIG. 2. In the illustrated embodiment, the network of attenuators 220 includes a series arrangement of a fixed attenuator 322 and a variable attenuator 324 forming a transmit signal path. That is, the network of attenuators 220 is connected between an I/Q modulator (not shown) and a power amplifier (not shown). The fixed attenuator 322 is coupled at its input and output by a switch 325, which operates in accordance with an enable/disable signal provided from the controller 260 on connection 263. Although the fixed attenuator 322 is implemented in the illustrated embodiment as a single attenuator, it should be understood that in alternative embodiments, the fixed attenuation could be implemented via a combination of several independently bypassable attenuators and in other alternative embodiments could further include one or more shunting branches associated with one or more of the independently bypassable attenuators as may be desired. Moreover, the compensated gain could be made programmable and adjusted to match a programmable attenuator (e.g., in a digital circuit implementation in which the programmable attenuator is adjusted by a digital control signal). Depending on the desired accuracy of the steps in the programmable version of the compensator, an automatic gain control curve could be provided by testing the compensator during manufacture. In addition, such a modified gain control system could be used to determine a compression point introduced by an output signal amplifier. The compression point could be identified by monitoring the gain of the output stage over an increase in the signal power provided to the output stage.

In embodiments that change the negative gain provided by the fixed attenuation a corresponding change to the gain provided by the compensator 230 is desired. By way of example, if a modified network of attenuators provides for fixed attenuation steps of 3 dB, 6 dB, and 12 dB, a modified compensator should be inserted that provides corresponding amounts of gain to the transmit signal to cancel the applied fixed attenuation. Stated another way, when 3 dB of fixed attenuation is applied, the compensator 230 provides 3 dB of gain. Similarly, when 6 dB of fixed attenuation is applied, the compensator 230 provides 6 dB of gain.

In accordance with a disable condition defined by the controller 260, the switch 325 is closed and an input signal from the I/Q modulator (not shown) on connection 205 bypasses the fixed attenuator 322 and is coupled to an input of the variable attenuator 324. When the switch 325 is closed, the total attenuation provided by the network of attenuators 220 is equal to the attenuation of the variable attenuator 324 and an attenuated representation of the input signal is forwarded on connection 225 to the power amplifier (not shown).

In accordance with an enable condition, the switch 325 is opened and an input signal on connection 205 is attenuated by an amount equal to that provided by the fixed attenuator 322 and the attenuation of the variable attenuator 324. The enable condition can be set in conjunction with a power control schedule stored in a memory 262 in communication with the controller 260 (FIG. 2) that calls for a transition in the transmitted or output signal power. To provide a smooth step transition in overall gain (i.e., negative gain or attenuation), the controller 260 is configured to decrease the attenuation provided by the variable attenuator 324 by an amount close to the attenuation of the fixed attenuator 322 when the fixed attenuator 322 is introduced to the signal path. That is, the variable attenuator 324 is adjusted to decrease its attenuation by an amount that approximates the attenuation of the fixed attenuator 322 at a time corresponding to the opening of the switch 325. Thus, the controller 260 (FIG. 2) is configured to keep the total attenuation provided by the network of attenuators 220 unchanged when the above-described switch and configuration adjustment is accomplished in the network of attenuators 220.

Consider the situation where the network of attenuators 220 is directed by the controller 260 to provide a total attenuation that exceeds the attenuation range of the variable attenuator 324. When this is the case, the controller 260 will provide a suitable signal on connection 263 to open the switch 325 and add the attenuation provided by the fixed attenuator 322 to the transmit signal path. Substantially simultaneously, the controller 260 will provide a suitable signal on connection 275 to reduce the attenuation provided by the variable attenuator 324 by the amount of attenuation introduced by the fixed attenuator 322. Thereafter, the controller 260 can further adjust the control signal on connection 275 to provide or remove attenuation to emit the desired transmit power from the mobile communication device 100.

An attenuation mismatch occurs when the attenuation provided by the fixed attenuator 322 does not match the attenuation removed by adjusting the variable attenuator 324. Attenuation mismatches can occur because of component variation in the fixed attenuator 322 and the variable attenuator 324 as a result of manufacturing variation as well as changes in these components over time, temperature, and frequency. The gain control system 200 reduces discontinuities in the attenuation provided in a network of attenuators 220 in the transmit signal path.

As described below in association with the embodiment illustrated in FIGS. 4 and 5, the gain control system 200 measures and records a first error value before the fixed attenuation is enabled. The gain control system 200 measures a second error value after the fixed attenuation is enabled and the variable attenuator is correspondingly adjusted. Thus, the overall negative gain (or attenuation in the network of attenuators 220 before and after enabling the fixed attenuator 322) will be substantially the same. The controller 260 further adjusts the variable attenuator in accordance with a function of the first error value and the second error value to reduce power discontinuities due to attenuation mismatches and to a lesser extent variation in the variable attenuator over time, temperature and frequency. The gain control system 200 can repeatedly measure and record error values and applies the same to a function to generate a control signal that adjusts the network of attenuators 220 when the mobile communication device 100 is operating in the above-described low-power control range and accurate step adjustments are desired.

Should a difference occur between a first error value and a second or subsequent error value due to an attenuation mismatch, the subsequent error signal will be different from the stored error signal value in the memory 262 associated with the controller 260. The controller 260 compares the stored error value with the subsequent error value and modifies the control signal on connection 265 to reduce an attenuation mismatch introduced between the variable attenuator 324 and the fixed attenuator 322 at a transition in a power control schedule or in the absence of such a transition to more accurately adjust the variable attenuator 324 to achieve a desired step change in emitted power within the required tolerance provided in Table I.

Figure 4:
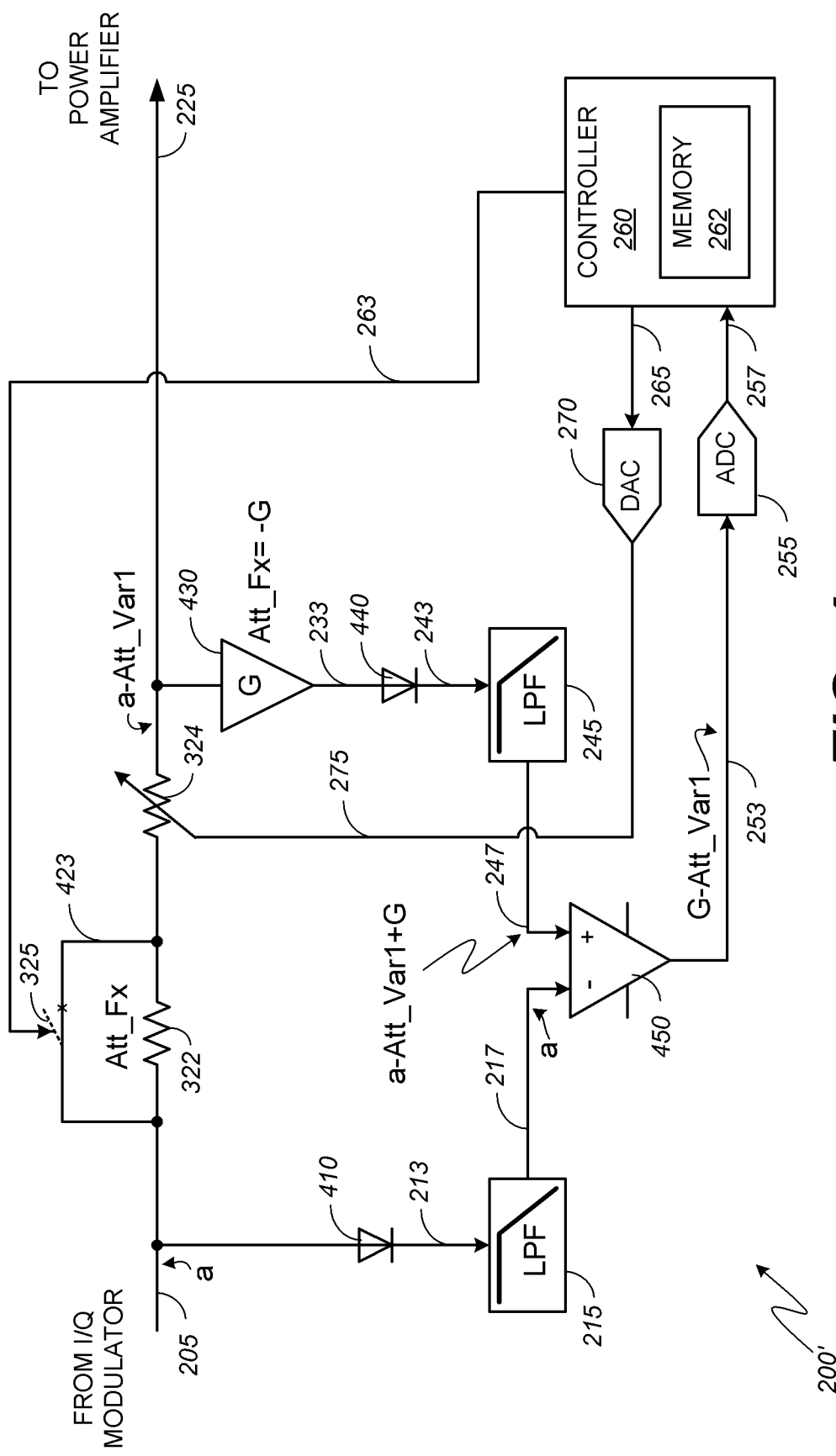
FIG. 4 is a schematic diagram of a more detailed embodiment of the gain control system of FIG. 2 before fixed attenuation is enabled.

FIG. 4 is a schematic diagram of a more detailed embodiment of the gain control system of FIG. 2 before fixed attenuation is enabled. As further indicated in the illustrated embodiment, the compensator 230 (FIG. 2) can be implemented by an amplifier 430 with a gain, G, that approximates the magnitude of the attenuation (Att_Fx) provided by the fixed attenuator 322. In addition, each of the detectors 210, 240 (FIG. 2) can be implemented by a respective diode detector 410, 440, and the comparator 250 (FIG. 2) can be implemented by a circuit including an operational amplifier 450 with a reference or inverting input coupled to the connection 217 and a signal or non-inverting input coupled to the connection 247.

The gain control system 200' is represented before fixed attenuation is enabled. That is, the switch 325 is closed and the input signal follows the bypass path 423. As indicated in FIG. 4, an input signal having a power, "a," as provided on connection 205, is detected by diode detector 410 to generate a signal on connection 213 that is a function of the signal power "a." The signal that is a function of the signal power "a" is then low-pass filtered by filter 215 and forwarded on connection 217 to the reference or inverting input of the operational amplifier 450. Before the fixed attenuator 322 is introduced to the gain control system 200', the signal at the input to the compensator 430 is the difference of "a" (the input signal power) and the power loss in the variable attenuator or "a−Att_Var1." The signal that is a function of the signal power "a" and the attenuation "Att_Var1" provided by the variable attenuator 324 is gain adjusted by the amplifier 430 before being sent on connection 233 to the diode detector 440. The diode detector 440 generates a signal on connection 243 that is a function of the gain adjusted signal power on connection 233. Thus, the gain adjusted signal that is a function of the signal power "a" and the attenuation "Att_Var1" provided by the variable attenuator 324 is low-pass filtered by filter 245 and forwarded to the signal or non-inverting input of the operational amplifier 450. Thus, the signal detected by diode detector 440 is the signal power of the input signal less the attenuation of the variable attenuator but including the gain G of amplifier 430, such that at the signal or non-inverting input of the operational amplifier 450 is the difference of the input signal power and the sum of power loss in the variable attenuator and the increase in signal power or gain provided by the compensator 230, shown here as "a−Att_Var1+G." Accordingly, the error signal on connection 253 at the output of the operational amplifier 450 can be represented by "G−Att_Var1." As described above, the error signal (i.e., a signal (i.e., a first error signal) on connection 253 is sampled and digitized in ADC 255. The digitized representation of the first error signal is forwarded on connection 257 to the controller 260, where it can be stored in a suitable location in memory 262 for subsequent processing by the controller 260.

Figure 5:
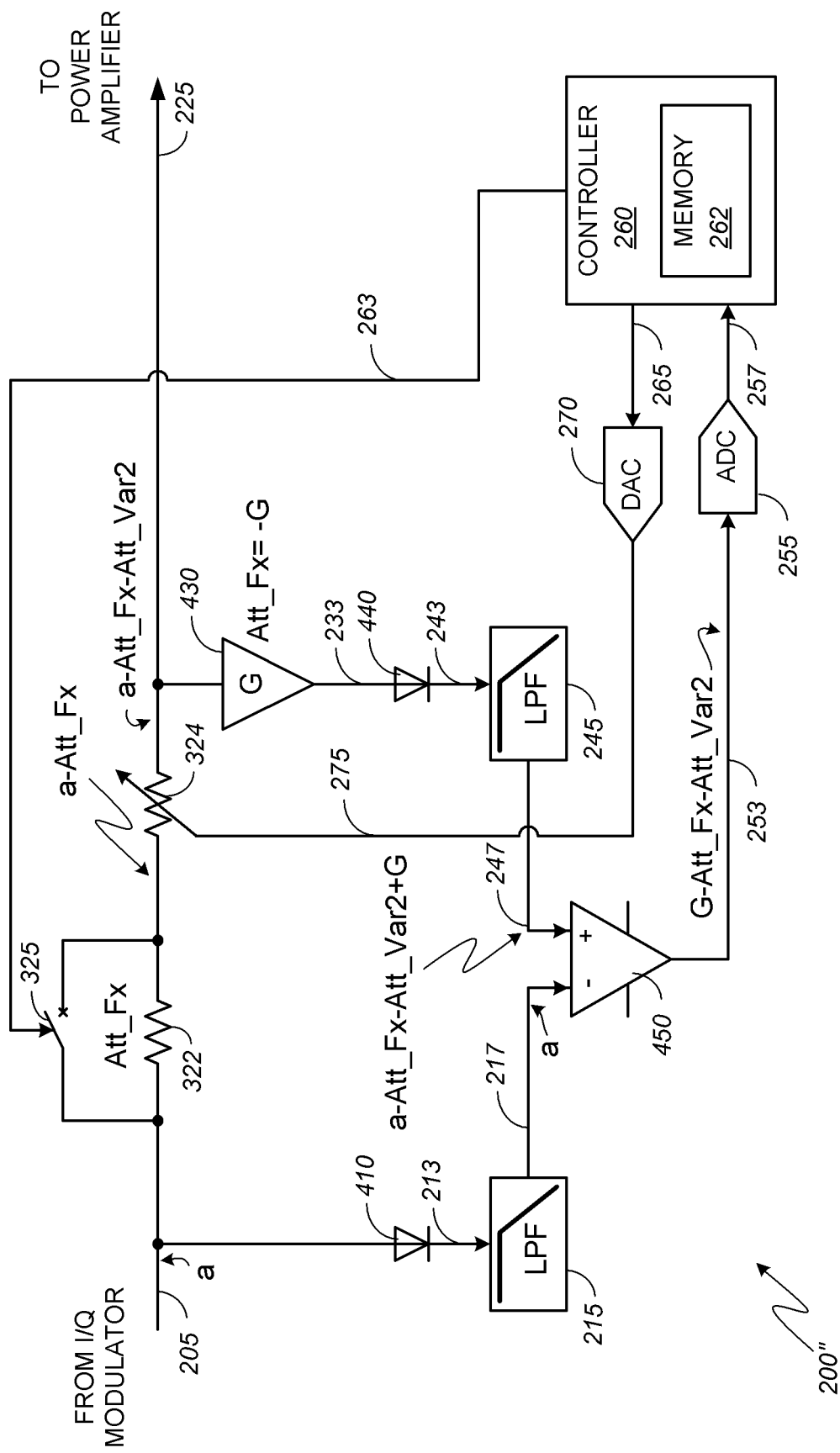
FIG. 5 is a schematic diagram of a more detailed embodiment of the gain control system of FIG. 2 after fixed attenuation is enabled.

FIG. 5 is a schematic diagram of a more detailed embodiment of a gain control system 200" after fixed attenuation is enabled. That is, the switch 325 is opened. As indicated in FIG. 5, an input signal having a power, "a," as provided on connection 205, is detected by diode detector 410 to generate a signal on connection 213 that is a function of the signal power "a." The signal that is a function of the signal power "a" is then low-pass filtered by filter 215 and forwarded to the reference or inverting input of the operational amplifier 450 on connection 217. After the fixed attenuator 322 is introduced to the gain control system 200", the signal at the input to the compensator 430 is the difference of "a" (the input signal power) and the power loss in the fixed attenuator 322 and the power loss in the variable attenuator or "a−Att_Fx−Att_Var1." The signal that is a function of the signal power "a" and the total attenuation "Att_Fx+Att_Var1" provided by the fixed attenuator 322 and the variable attenuator 324 is gain adjusted by the amplifier 430 in an amount substantially equivalent to the attenuation loss Att_Fx due to the fixed attenuator 322 before being sent on connection 233 to the diode detector 440. Thus, the gain adjusted signal that is a function of the signal powers "a" and the total attenuation "Att_Fx+Att_Var1" is provided on connection 243 to the filter 245. The output of the low-pass filter 245 is forwarded on connection 247 to the signal or non-inverting input of the operational amplifier 450. Thus, the signal detected by diode detector 440 is the signal power of the input signal less the total attenuation of the fixed and variable attenuators 322, 324 but including the gain G of amplifier 430, such that at the signal or non-inverting input of the operational amplifier 450 is the difference of the input signal power and the sum of power loss in the fixed and variable attenuators 322, 324 and the increase in signal power or gain provided by the compensator 230, shown here as "a−Att_Fx−Att_Var2+G." Accordingly, the error signal on connection 253 at the output of the operational amplifier 450 can be represented by "G−Att_Fx−Att_Var2." As described above, the error signal (i.e., a second error signal) on connection 253 is sampled and digitized in ADC 255 and forwarded on connection 257 to the controller 260. The second error signal and the previously stored first error signal are applied by the controller 260 in a logical function to generate a suitable control word which is communicated on connection 265 to the DAC 270. In turn, the DAC 270 generates an analog control signal that is forwarded on connection 275 to a control input of the variable attenuator 324.

Figure 6A:
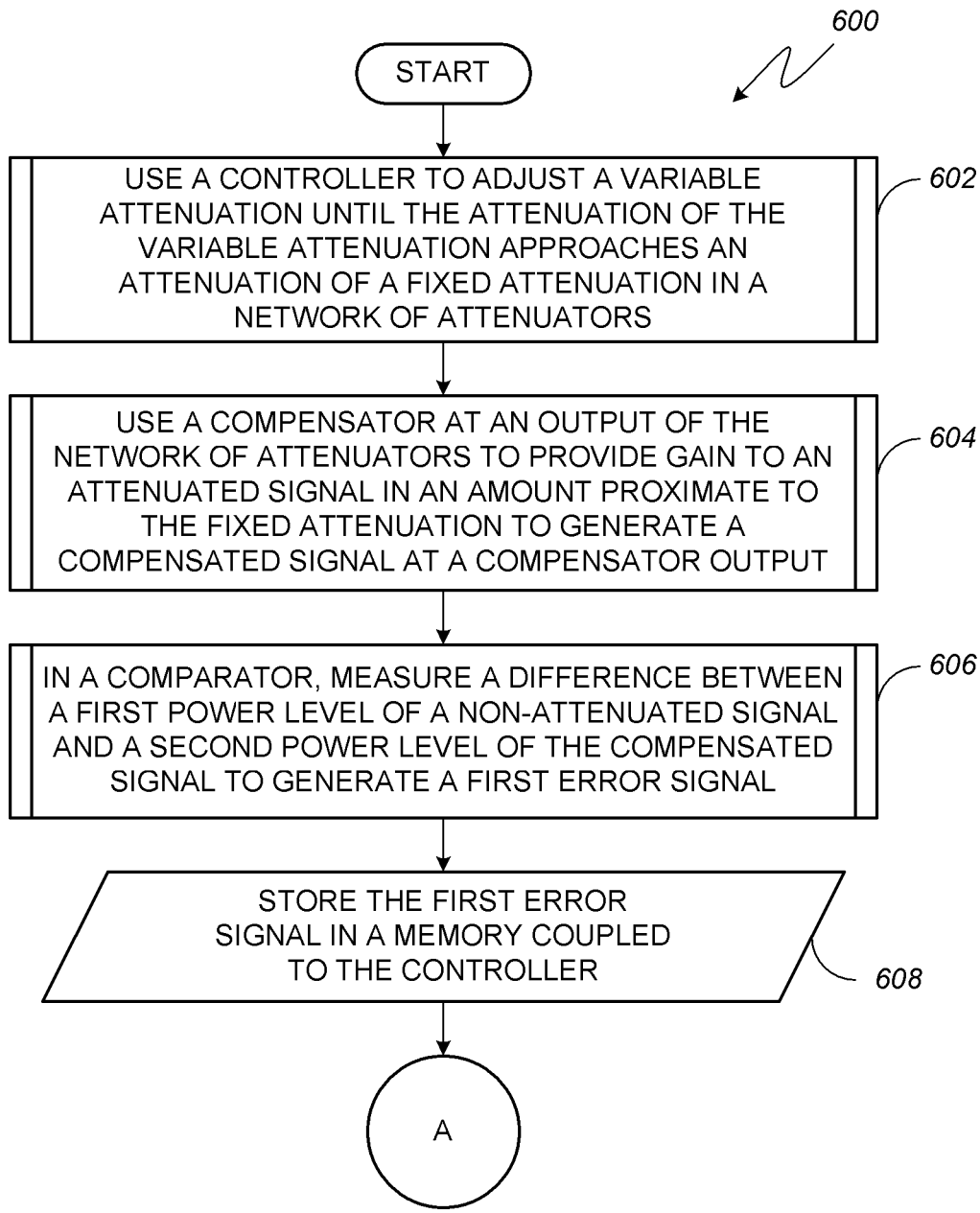
FIGS. 6A-6B include a flow diagram illustrating an embodiment of a method for controlling an adjustable power level using the gain control system of FIG. 1.
Figure 6B:
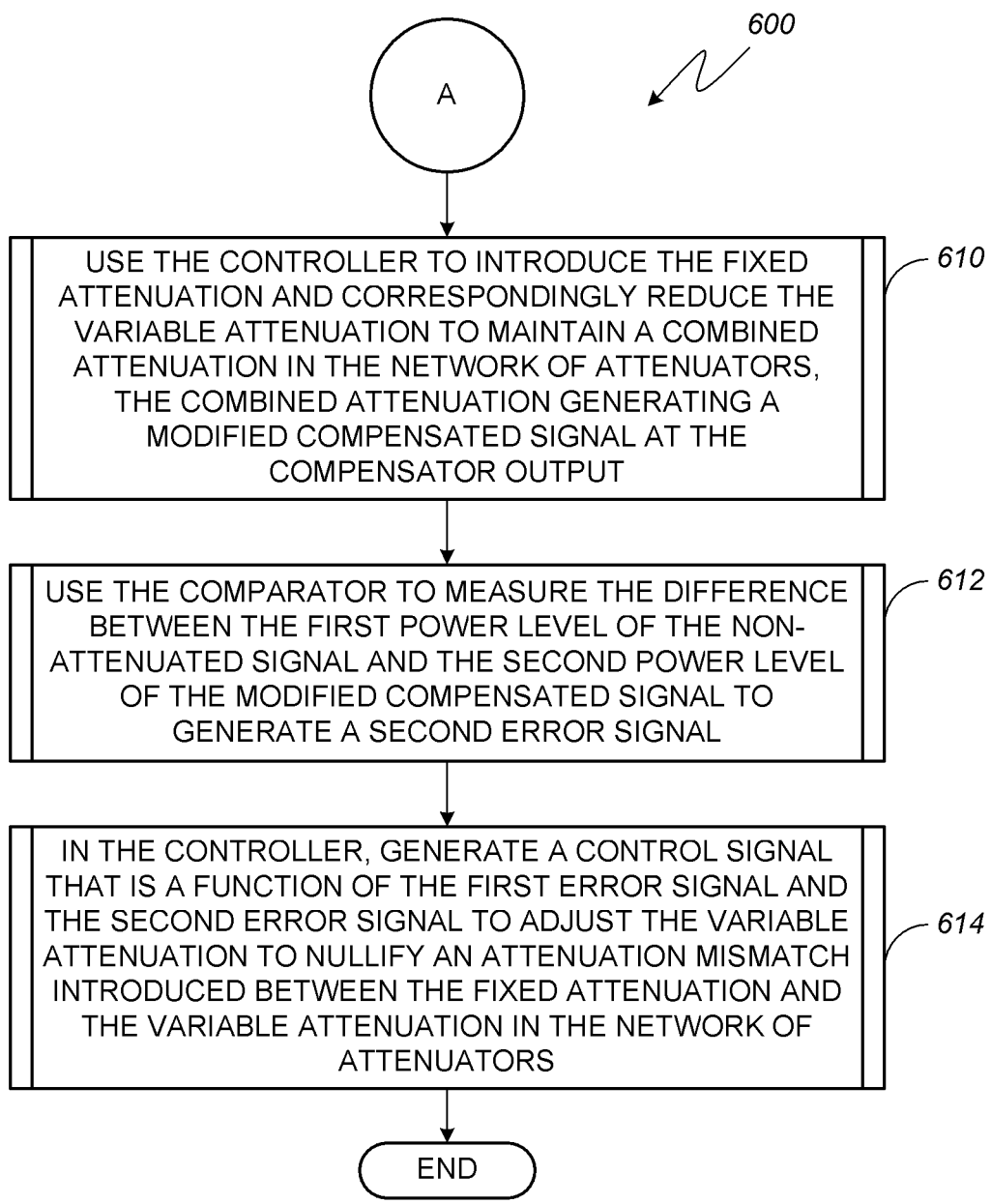

FIGS. 6A-6B include a flow diagram illustrating an embodiment of a method 600 for controlling an adjustable power level that can be implemented by the gain control system 200. The flow diagram shows the architecture, functionality, and operation of the gain control system 200 wherein a network of attenuators 220 including a fixed attenuator 322 that provides a fixed attenuation and a variable attenuator 324 that provides a controlled and variable attenuation are controllably bypassed and/or adjusted, respectively, to modify signal power over at least a portion of the dynamic range of an emitted power transmitted from the mobile communication device 100. In this regard, one or more blocks represent the functions of circuit elements in the gain control system 200.

The method 600 begins with block 602 where a controller 260 is used to adjust a variable attenuation (e.g., the variable attenuator 324) until the attenuation provided by the variable attenuator 324 approaches an attenuation of a fixed attenuation (e.g., the attenuation provided by the fixed attenuator 322) in a network of attenuators 220. In block 604, a compensator 230 at an output of a network of attenuators 220 is used to provide signal gain in an amount proximate to the fixed attenuation to generate a compensated signal at a compensator output. Preferably, the compensator 230 provides a gain or amplification of an attenuated signal in an amount that approximates the amount of attenuation provided by the fixed attenuator 322 in the network of attenuators 220. As attenuation is required to adjust the output power level, the variable attenuator 324 is adjusted until the attenuation of the variable attenuator 324 approaches the attenuation of the fixed attenuator 322 in the network of attenuators 220 Thereafter, as indicated in block 606, a comparator 250 or an operational amplifier 450 is used to measure a difference between a first power level of a non-attenuated signal and a second power level of the compensated signal to generate a first error signal. In input/output block 608, the first error signal is stored in a memory (e.g., memory element 262) coupled to the controller 260.

As indicated by the connector labeled "A," the method continues with block 610 in FIG. 6B where the controller 260 introduces the fixed attenuation (e.g., by communicating an enable/disable signal to open the switch 325) and correspondingly reduces the variable attenuation (e.g., by adjusting the signal on connection 265) to maintain a combined attenuation in the network of attenuators 220. As further indicated in block 610, the combined attenuation after the introduction of the fixed attenuation and the corresponding adjustment (i.e., reduction) of the attenuation provided by the variable attenuation generates a modified compensated signal at the output of the compensator 230.

Once the fixed attenuator 322 is enabled by opening the switch 325 and the variable attenuator 324 has been correspondingly adjusted by the controller 260, the comparator 250 is used to measure the difference between the first power level of the non-attenuated or received signal and a second power level of an attenuated and modified compensated signal to generate a second error signal, as indicated in block 612. Thereafter, as shown in block 614, the controller 260 generates a control signal that is a function of the first error signal and the second error signal and forwards the same to a control input of the variable attenuator 324 by way of the DAC 270 to adjust the variable attenuator 324 in a manner that nullifies or substantially reduces an attenuation mismatch introduced by the fixed attenuator 322 and the variable attenuator 324.

Those skilled in the art of power control systems as applied in RF transmitters of the type commonly deployed in mobile cellular handsets could readily adapt the present gain control system 200 and methods for controlling an adjustable power level for implementation in a transmitter or other suitable application.

While various embodiments of the gain control systems and methods for controlling an adjustable power level have been described, it will be apparent to those of ordinary skill in the art that many more embodiments and implementations are possible. For example, the gain control systems and methods for controlling an adjustable power level are not limited to a specific type of radio transmitter or power amplifier. Embodiments of the gain control systems and methods for controlling an adjustable power level are applicable to different types of radio transmitters and power amplifiers and are applicable to any transmitter that transmits a non-constant envelope signal. In addition, embodiments of the gain control systems and methods for controlling an adjustable power level are applicable to systems where a nearly continuous output signal power is desired.

What is claimed is:
1. A system, comprising:
   a first power detector configured to detect a power of a radio-frequency (RF) signal and to provide a first power detector output;
   a network of attenuators configured to provide a fixed attenuation and a variable attenuation, the network of attenuators coupled to receive the RF signal and forward an attenuated signal;
   a compensator configured to receive the attenuated signal and to provide gain to the attenuated signal in an amount proximate to the fixed attenuation to generate a compensated signal at a compensator output;
   a second power detector configured to detect a power output of the compensated signal and to provide a second power detector output; and
   a comparator configured to receive the first power detector output and the second power detector output, and generate a first error signal.

2. The system of claim 1 further comprising a controller configured to direct the network of attenuators to controllably bypass the fixed attenuation when the first error signal is generated.

3. The system of claim 2 wherein the controller is further configured to receive the first error signal, enable the fixed attenuation, correspondingly adjust the variable attenuation, receive a second error signal responsive to the total attenuation from the combination of the fixed attenuation and the adjusted variable attenuation.

4. The system of claim 3 wherein the controller is further configured to provide a control signal to the network of attenuators as a function of the first error signal and the second error signal to nullify or reduce an attenuation mismatch introduced between the fixed attenuation and the adjusted variable attenuation.

5. The system of claim 4 wherein the controller is configured to modify the control signal such that an overall attenuation introduced by the network of attenuators before and after enabling the fixed attenuator is about the same.

6. The system of claim 4 wherein the controller includes a memory that stores the first error signal before enabling the fixed attenuation.

7. The system of claim 4 further comprising an analog-to-digital converter (ADC) configured to receive the first error signal and the second error signal, the ADC configured to generate digital representations thereof that are provided to the controller.

8. The system of claim 4 further comprising: a digital-to-analog converter (DAC) configured to receive the control signal and generate an analog representation thereof that is provided to a control input that modifies the variable attenuation.

9. The system of claim 4 wherein an attenuation control range provided by the controller and the variable attenuation is at least 5 dB greater than a step change provided by enabling the fixed attenuation.

10. The system of claim 1 wherein the first power detector and an input of the network of attenuators are coupled to a modulator.

11. The system of claim 1 wherein an output of the network of attenuators is coupled to a power amplifier.

12. The system of claim 1 wherein the first and second power detectors are diode detectors.

13. The system of claim 1 further comprising:
a first low-pass filter coupled to the first power detector output and a first input of the comparator; and
a second low-pass filter coupled to the second power detector output and a second input of the comparator.

14. A wireless device, comprising:
a baseband subsystem;
a transmitter in communication with the baseband subsystem, the transmitter having a gain control system, the gain control system including a first power detector configured to detect a power of a radio-frequency (RF) signal and to provide a first power detector output; a network of attenuators configured to provide a fixed attenuation and a variable attenuation, the network of attenuators coupled to receive the RF signal and forward an attenuated signal; a compensator configured to receive the attenuated signal and to provide gain to the attenuated signal in an amount proximate to the fixed attenuation to generate a compensated signal at a compensator output; a second power detector configured to detect a power output of the compensated signal and to provide a second power detector output; and a comparator configured to receive the first power detector output and the second power detector output, and generate a first error signal; and
an antenna in communication with the transmitter and configured to facilitate transmission of the RF signal.

15. The wireless device of claim 14 further comprising a controller configured to direct the network of attenuators to controllably bypass the fixed attenuation when the first error signal is generated.

16. The wireless device of claim 15 wherein the controller is further configured to receive the first error signal, enable the fixed attenuation, correspondingly adjust the variable attenuation, receive a second error signal responsive to the total attenuation from the combination of the fixed attenuation and the adjusted variable attenuation.

17. The wireless device of claim 16 wherein the controller is further configured to provide a control signal to the network of attenuators as a function of the first error signal and the second error signal to nullify or reduce an attenuation mismatch introduced between the fixed attenuation and the adjusted variable attenuation.

18. The wireless device of claim 17 wherein the controller is configured to modify the control signal such that an overall attenuation introduced by the network of attenuators before and after enabling the fixed attenuator is about the same.

19. The wireless device of claim 17 wherein the controller includes a memory that stores the first error signal before enabling the fixed attenuation.

20. The wireless device of claim 17 further comprising an analog-to-digital converter (ADC) configured to receive the first error signal and the second error signal, the ADC configured to generate digital representations thereof that are provided to the controller.

21. The wireless device of claim 17 further comprising: a digital-to-analog converter (DAC) configured to receive the control signal and generate an analog representation thereof that is provided to a control input that modifies the variable attenuation.

22. The wireless device of claim 17 wherein an attenuation control range provided by the controller and the variable attenuation is at least 5 dB greater than a step change provided by enabling the fixed attenuation.

23. The wireless device of claim 14 wherein the first power detector and an input of the network of attenuators are coupled to a modulator.

* * * * *